United States Patent [19]
Russell et al.

[11] Patent Number: 5,432,678
[45] Date of Patent: Jul. 11, 1995

[54] HIGH POWER DISSIPATION VERTICAL MOUNTED PACKAGE FOR SURFACE MOUNT APPLICATION

[75] Inventors: Ernest Russell, Richmond; Daniel Baudouin, Missouri City; James S. Wallace, Sugar Land, all of Tex.

[73] Assignee: Texas Instruments Incorporated, Dallas, Tex.

[21] Appl. No.: 241,530

[22] Filed: May 12, 1994

[51] Int. Cl.⁶ .................................................. H05K 7/02
[52] U.S. Cl. ........................ 361/760; 361/772; 361/773; 361/825; 174/260; 174/261; 257/690; 257/692; 257/696; 257/784
[58] Field of Search ................ 361/760–764, 361/769, 772–774, 777, 784–785, 787, 736–737, 741, 748, 756, 825; 174/260, 261, 267; 257/690, 692–696, 784, 786

[56] References Cited

U.S. PATENT DOCUMENTS

| | | |
|---|---|---|
| 3,268,772 | 8/1966 | Kamei et al. . |
| 3,567,998 | 3/1971 | Ammerman . |
| 3,764,955 | 10/1973 | Ward . |
| 4,426,689 | 1/1984 | Henle et al. ........................ 361/749 |
| 4,477,135 | 10/1984 | Pronto ................................... 211/41 |
| 4,546,406 | 10/1985 | Spinelli et al. . |
| 4,750,089 | 6/1988 | Derryberry et al. . |
| 4,855,809 | 8/1989 | Malhi et al. . |
| 4,963,697 | 10/1990 | Peterson et al. ...................... 174/252 |
| 4,967,042 | 10/1990 | Shepherd et al. ..................... 174/250 |
| 4,974,057 | 11/1990 | Tazima . |
| 4,975,763 | 12/1990 | Baudouin et al. . |
| 4,979,015 | 12/1990 | Stierman et al. . |
| 4,982,268 | 1/1991 | Schuermann . |
| 5,059,557 | 10/1991 | Cragon et al. ........................ 437/208 |
| 5,089,993 | 2/1992 | Neal et al. ............................. 365/63 |
| 5,260,601 | 11/1993 | Baudouin et al. .................... 257/678 |
| 5,339,219 | 8/1994 | Urich .................................... 361/760 |

*Primary Examiner*—Bot LeDynh
*Attorney, Agent, or Firm*—W. Daniel Swayze, Jr.; Richard L. Donaldson

[57] ABSTRACT

A mounting device (170) of a semiconductor integrated circuit (202) allows edge mounting on surface of a printed circuit board (250). The mounting device includes a top portion (150) to provide for cooling and protection of the semiconductor chip while a side portion (140) provides for cooling and positioning on the printed circuit board.

13 Claims, 4 Drawing Sheets

HIGH POWER DISSIPATION VERTICAL MOUNTED PACKAGE FOR SURFACE MOUNT APPLICATION

TECHNICAL FIELD OF THE INVENTION

This invention relates to semiconductor devices and, more particularly, to surface-mount packages for integrated circuit devices.

BACKGROUND OF THE INVENTION

Integrated circuit devices have been housed in dual-in-line plastic packages, referred to as DIP packages, for many years in semiconductor manufacturer. These DIP packages have leads extending through holes in a printed circuit board and the package itself is mounted fiat on the board. Additionally, surface-mount packaging has been introduced, and this technique eliminates the necessity of soldering leads in holes in the printed circuit PC boards so that the leads and the PC board conductor can be closer together and higher densities of the packages are achieved. However, these higher densities and increased processing capabilities results in the greater generation and retention of heat. Thus, a need for increased cooling of these packages has arisen. Further, edge-mounted packages or modules have been used to increase the density of devices, improving cooling and reducing cost.

U.S. Pat. No. 5,260,601 illustrates a flat package for semiconductor integrated circuit devices, allowing edge-mounting and surface mount.

As the complexity of the integrated circuit and the power required by these integrated circuits increases, the above-mentioned device fails to provide a heat sink sufficient for the needs of the integrated circuit.

SUMMARY OF THE INVENTION

The present invention provides increased packing density on the PC board for the integrated circuit, satisfying the increasing density needs of the PC board. The present invention provides a more efficient heat sink having increased cooling by allowing air to more freely circulate around the integrated circuit. The heat sink is achieved primarily thru conduction of heat from integrated circuit through the mounting device to the PC board, and through the leads from the integrated circuit to P.C. board. The present invention minimizes or eliminates the plastic used to encapsulate or blanket the integrated circuit. The mounting pad may be exposed on opposite sides of integrated circuit. The integrated circuit may be protected by epoxy plastic or may be uncoated. The present invention increases the sectional size of the leads or wires connecting the integrated circuit chip. The present invention provides a mounting pad for the integrated circuit chip and provides feet or guides.

The present invention includes a mounting device including a semiconductor chip, a plurality of leads for connecting the semiconductor chip to a printed circuit board, a first portion of the mounting device for mounting the semiconductor chip, the plurality of lead frames extending from one edge of the first portion, and a second portion of the mounting device projecting substantially perpendicular to the first portion to support the mounting device on the printed circuit board.

These and other features of the invention will be apparent to those skilled in the art from the following detailed description of the invention, taken together with the accompanying drawings.

DETAILED DESCRIPTION OF THE INVENTION

The present invention and its advantages are understood by referring to FIGS. 1–12 of the drawings, like numerals being used for like and corresponding parts of the various drawings.

Figure 1:
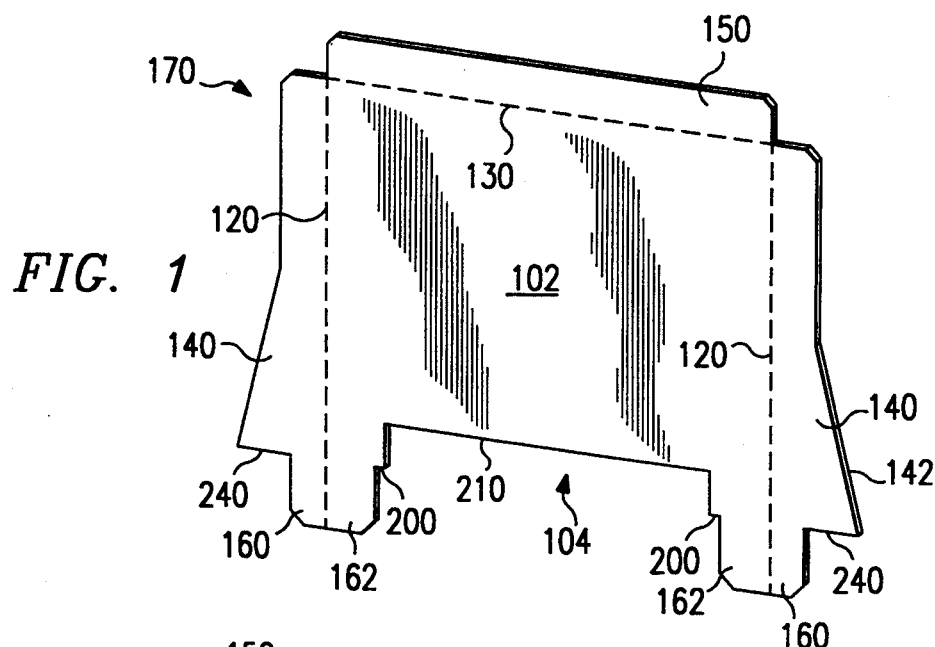
FIG. 1 illustrates a perspective view of a mounting device of the present invention, without an integrated circuit chip and without lead frames.
Figure 4:
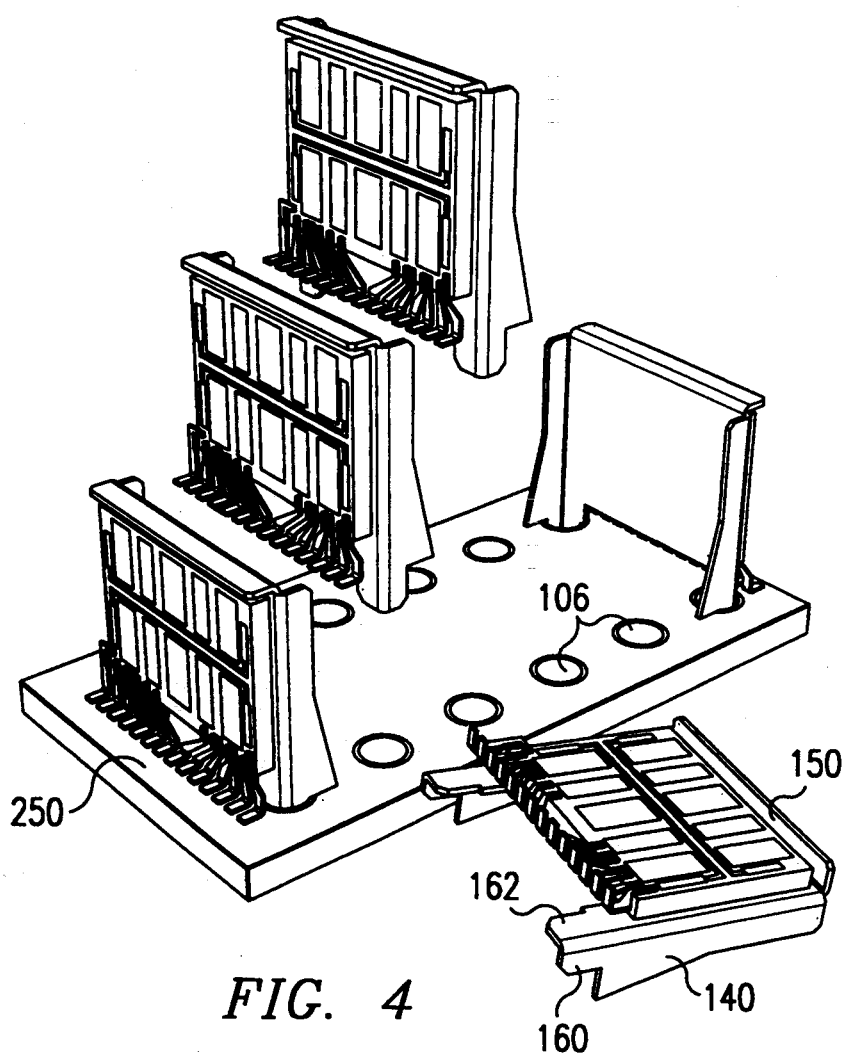
FIG. 4 illustrates a perspective view of the vertically mounted device on a PC board.

FIG. 1 illustrates mounting device (170) or mounting pad of the vertical mounted module or structure of the present invention. The mounting device (170) may be a metal plate or other thermally conductive material. FIG. 1 illustrates that main portion (102) of the mounting device (170) is adjacent to two side portions (140) of the mounting device (170) and is adjacent to top portion (150) of the mounting device (170). The main portion (102) of the mounting device (170) is adjacent to the aperture (104). The bend line (120) of the side portion (140) and the bend line (130) for the top portion (150) provides an indication where the mounting device may be folded substantially perpendicular to the main portion (102). By substantially, it is to be understood that any angle, for example 10, 20, 30 degrees, up to and including 30 degrees from 90 degrees is meant. FIG. 1 illustrates that the top portion (150) is substantially a rectangle; however, any shape may work equally well. Top portion (150) of the mounting device (170) provides an additional area for heat dissipation from the integrated circuit chip and if the top portion (150) is folded as shown in FIG. 4, toward the integrated circuit chip, to provide some protection for the integrated circuit chip. Although, the top portion (150) is shown to be integrated with the main portion (102), the top portion may be joined to the main portion (102), for example by welding. The side portion (140) of the mounting device includes an incline surface (142) which begins approximately at the midpoint of the side portion (140). This incline surface (142) forms an additional surface for flange (240), which acts as a stop for the mounting device (102). The flange (240) is positioned so that the lead frames are positioned adjacent to connections of the printed circuit board so that a connection may be made with the integrated circuit chip. The guide portion of the mounting device includes a side guide portion (160) and a central guide portion (162). The side guide portion (160) and the central guide portion (162) are inserted into a mounting aperture in the printed circuit board (not shown in FIG. 1) in order to provide spacing for the mounting device (170) and to position the mounting device (170) with respect to the PC boards (not shown). The guide portion of the device is formed by the edge of the mounting device (170). Like the flange (240), the flange (200) seats and provides a stop for the mounting device (170) when positioned in the aperture. The flange (200) is positioned so that the lead frames are positioned adjacent to the connection of the printed circuit board so that the connection may be made with the integrated circuit chip. The bottom surface (210) of the main portion (102) is adjacent to aperture (104). This aperture (104) provides space for the lead flames to be soldered or connected to the PC board.

Figure 2:
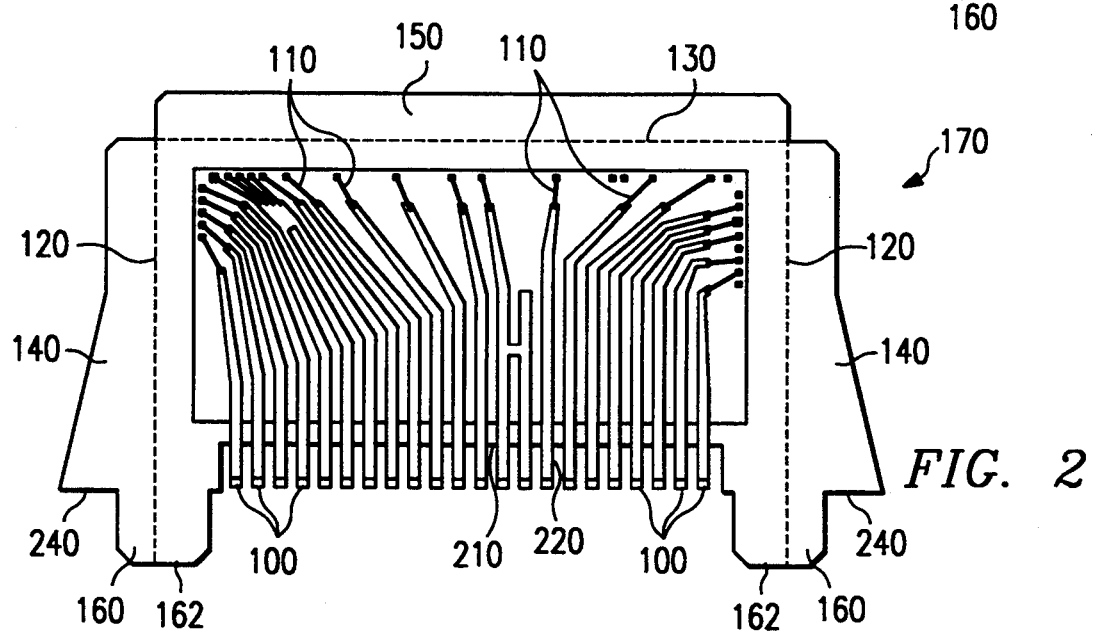
FIG. 2 illustrates a plan view of a mounting device of the present invention with lead frames and bond wire.

FIG. 2 illustrates the mounting device 170 with lead frames (100) to connect an integrated circuit chip with other chips or circuits through soldered points. The lead frames (100) are connected to bond wires (110) to connect the chip with the lead frame (100). Semiconductor chips are manufactured for insertion into mounting apertures (106). The input/output leads (not shown) of the semiconductor chips will correspond to the bond wires (110) and the lead flames 100 of the mounting device. Once the modules are mounted onto the printed circuit boards and the lead frames 100 are aligned with the connections of the printed circuit board. The connections and lead frames 100 are heated to reflow solder to form joints.

Figure 3:
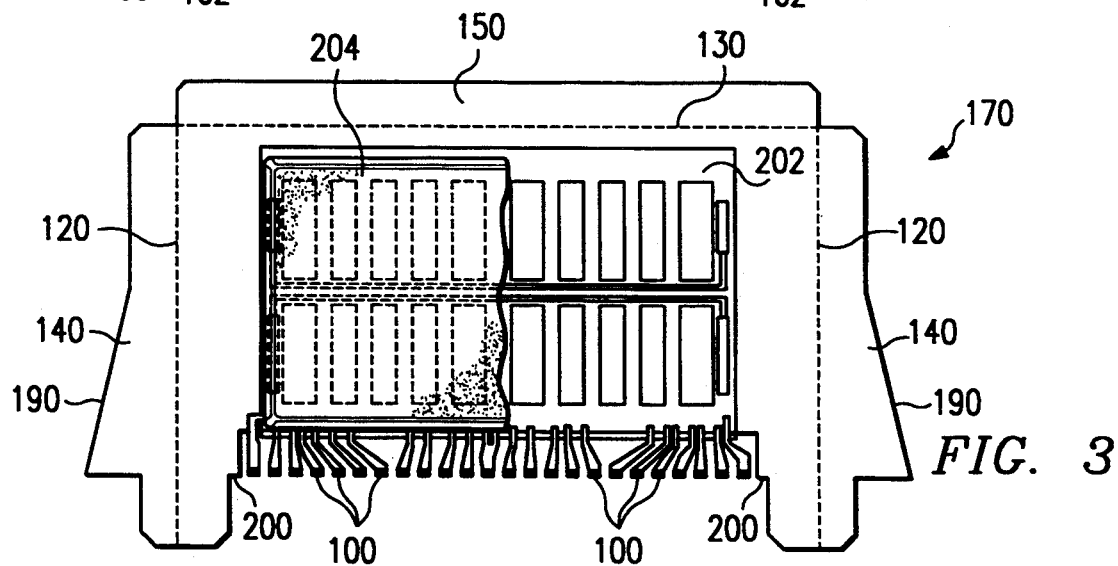
FIG. 3 illustrates a plan view of a vertically mounted device of the present invention including the mounting device, lead frames and integrated circuit chip.

FIG. 3 illustrates an integrated circuit chip (202) mounted on the mounting device (170) according to another embodiment of the invention. The integrated circuit may be bonded to the mounting pad (102) with thermally conductive adhesive or epoxy or similar common techniques to improve the heat transfer to the pad (102). Lead frame is direct attach, single edge connect technique, shown as example. The conformal coating 204, which may be formed on the bond wires and/or lead frame or the integrated chip surface, protects the bond wire and/or lead frame or may be formed so as not to reduce the heat dissipation capacity of the device.

FIG. 4 illustrates a plurality of mounting devices (170) and integrated circuit chips. The side guide portion (160) and central guide portion (162) are inserted into mounting aperture (106) in order to space the mounting device and to position the mounting pad substantially vertical.

The side guide position (160) and the central guide position (162) are substantially perpendicular to main position (102). FIG. 4 additionally illustrates that the side portion (140) is substantially perpendicular and opposite to the integrated circuit chip. This advantageously provides for a stable positioning of the mounting device in that the lead frame (110) and corresponding soldered connection are opposite to the side portion (140), preventing the mounting pad from being tilted.

To secure the side and central guide portions (160, 162) in the mounting aperture (106), solder or conductive epoxy may be applied to the aperture. This provides a grounding path for the substrate of the integrated circuit chip. Additionally, the side portion (140) may be unfolded to be parallel to the main portion (102) or may be folded to be perpendicular to main portion (102) and folded on the same side as the integrated circuit chip.

The top portion (150) may be folded so that the top portion is opposite to the integrated circuit chip.

Figure 5:
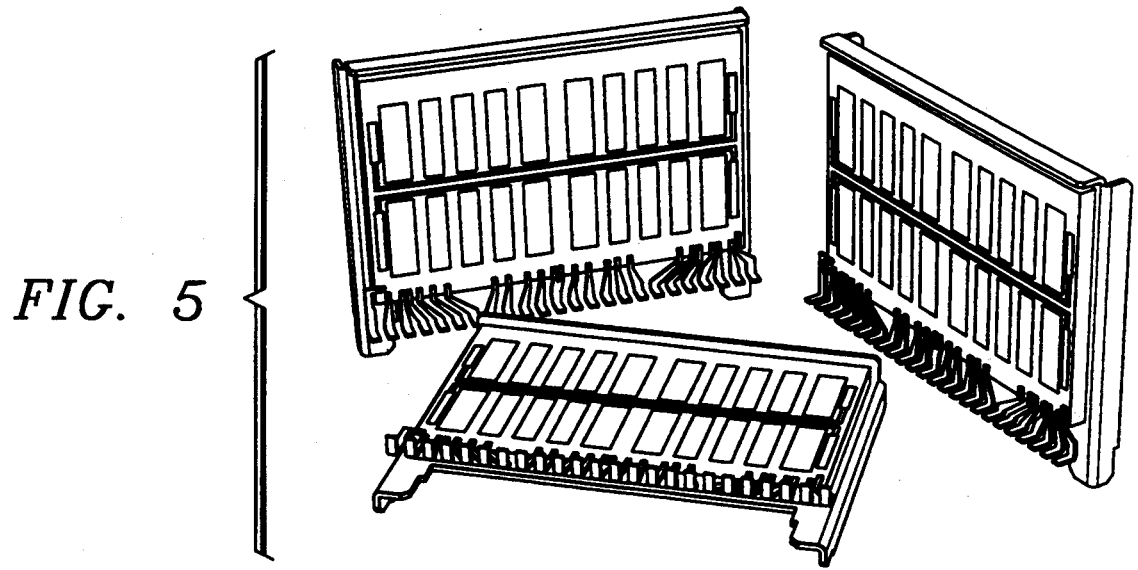
FIG. 5 illustrates a perspective view of three vertically mounted devices in accordance with the present invention.

FIG. 5 illustrates three perspectives of mounted devices with integrated circuit chips.

Figure 6:
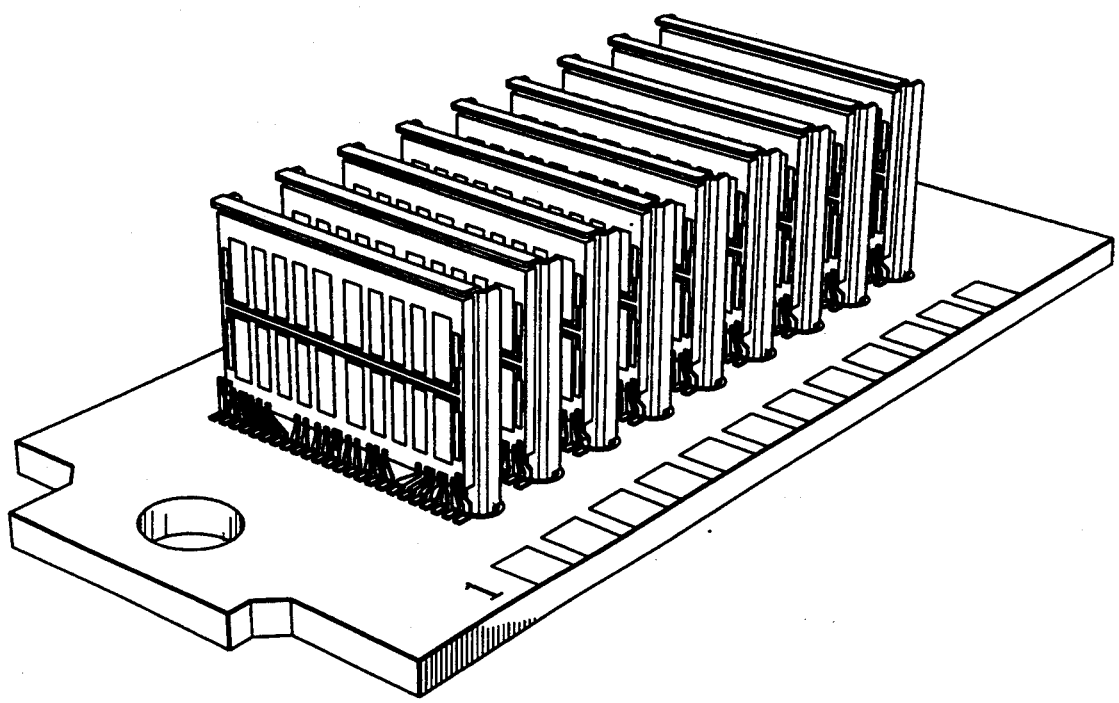
FIG. 6 illustrates a perspective view of a plurality of vertically mounted devices on a PC board in accordance with the present invention.

FIG. 6 illustrates a plurality of mounting devices (170) and integrated circuit chips mounted on a PC board.

Figure 7:
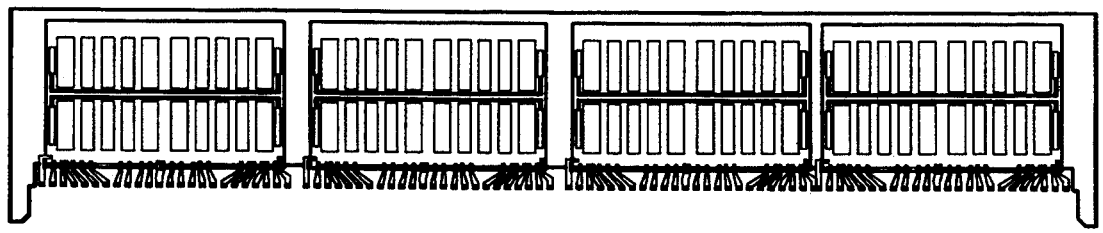
FIG. 7 illustrates a perspective view of a single vertically mounted module of the present invention with four integrated circuit chips.

FIG. 7 illustrates a plurality of integrated circuit chips, for example four, mounted on a single mounting device.

Figure 8:
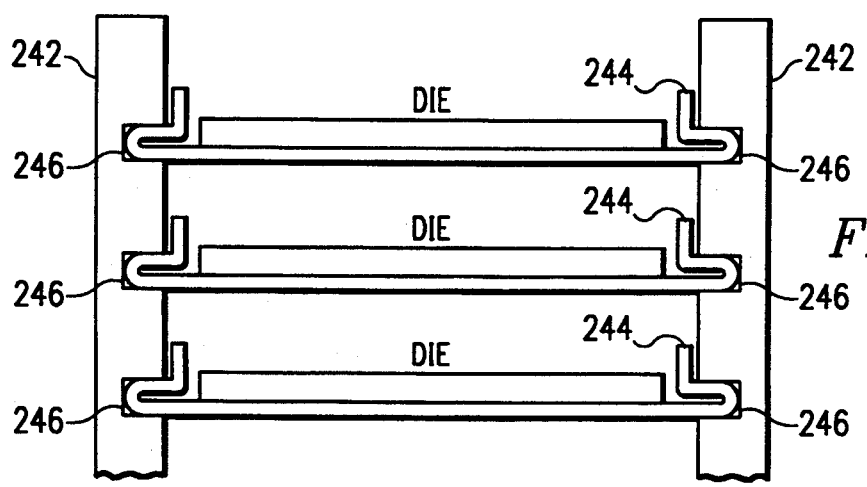
FIG. 8 illustrates a top plan view of a module with vertically mounted devices of the present invention with a spring loaded portion.

FIG. 8 illustrates a mounting device with a spring loaded portion of the mounted pad inserted in a frame (242) to engage the frame (242) and retain the mounting device. This embodiment of the present invention provides additional cooling capacity in that cooling is not restricted to air flow but is provided through the frame (242).

In addition to the cooling effect of the air among the integrated circuit chips, cooling is allowed by the heat being dissipated to the spring loaded portion (244).

Figure 9:
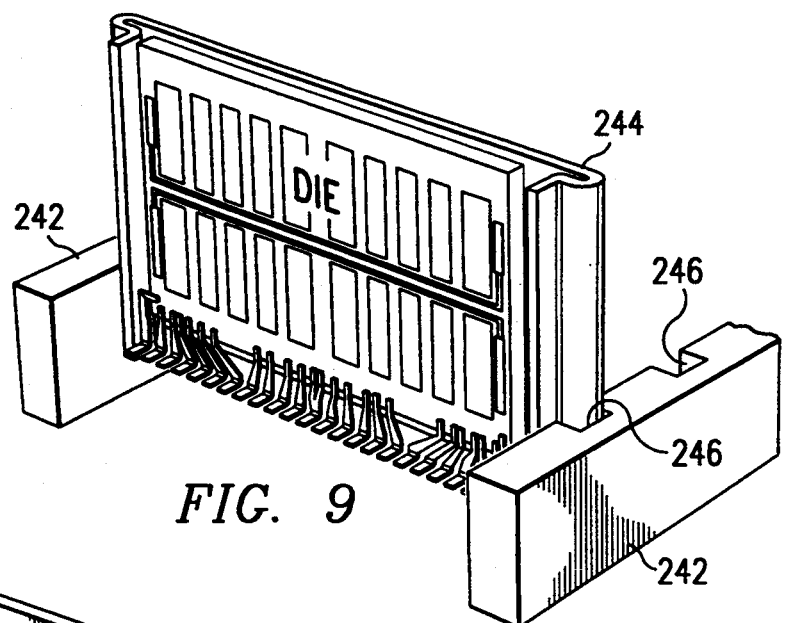
FIG. 9 illustrates a sectional view of the frame with the vertically maintained device.

FIG. 9 illustrates the mounting device with spring loaded portion of the mounting pad (244) being positioned within the frame (242). FIG. 9 illustrates that the spring loaded portion (244) is positioned with a channel (246) of the frame (242). The channel (246) guides the mounting pad so that the lead frames (100) are properly aligned with the pattern of the printed circuit board.

Figure 10:
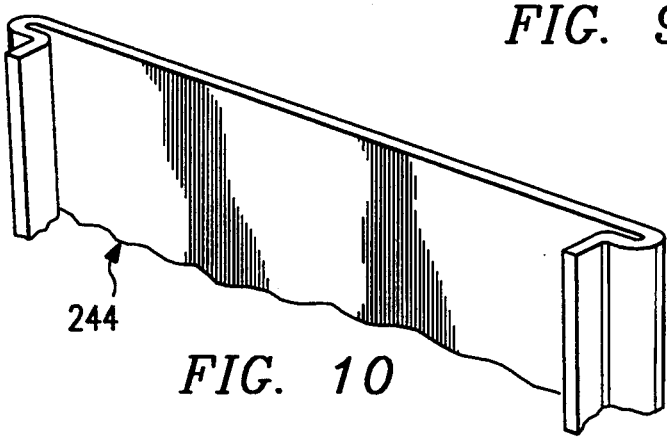
FIG. 10 illustrates a sectional view of the mounting pad with the spring loaded portion.

FIG. 10 illustrates the symmetric nature of the spring loaded portion (244). The integrated circuit chip may be mounted on either side of the mounting device. However, protection of the integrated circuit chip may be achieved if the integrated circuit chip is positioned with the cavity formed by the spring loaded portion (244).

Figure 11:
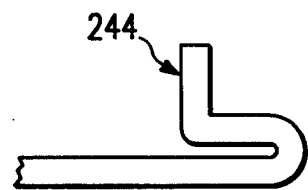
FIG. 11 illustrates a sectional view of the spring loaded portion of the mounting pad.

FIG. 11 illustrates a portion of the spring loaded portion (244).

Figure 12:
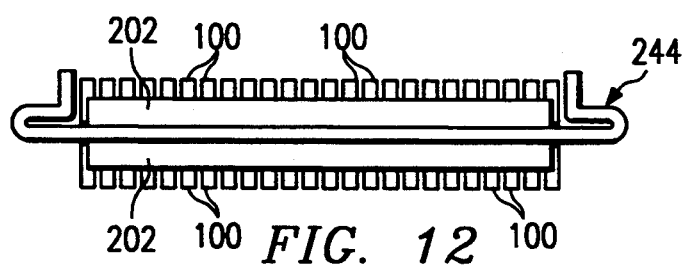
FIG. 12 illustrates a top view of the mounting pad with two opposite mounted integrated circuits.

FIG. 12 illustrates integrated circuit chip mounted opposite on both sides of the mounting device. Under these circumstances the capacity to remove heat by the mounting device is relatively unaffected by the two integrated circuits. Heat may be still conducted to the PC board through the flanges 125 and side portions 140.

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. The surface mounted integrated circuit structure comprising:
    a printed circuit board having a surface for mounting an integrated circuit device, the surface having a plurality of mounting apertures and circuit connections;
    a semiconductor integrated circuit device including a mounting device for mounting a semiconductor chip on a first portion of said mounting device, a plurality of leads extending from one edge of the mounting device, a second portion of said mounting device projecting substantially perpendicular to said first portion to support said mounting device on said printed circuit board and guides to be positioned within said mounting aperture, wherein said leads are substantially perpendicularly bent to connect with the printed circuit board.

2. The surface mounted integrated circuit as in claim 1, wherein said semiconductor integrated circuit device further includes a third portion positioned so that said semiconductor chip is located between said third portion and said printed circuit board.

3. The surface mounted integrated circuit as in claim 2, wherein third portion is bent to provide protection for said semiconductor chip.

4. The surface mounted integrated circuit as in claim 2, wherein said third portion is bent toward a side of the mounting device opposite said leads.

5. The surface mounted integrated circuit as in claim 1, wherein said semiconductor integrated circuit device includes a third portion projected in a direction opposite to a side of the semiconductor chip.

6. The surface mounted integrated circuit as in claim 1, wherein said second portion is spring loaded so as to engage with mounting device.

7. The mounting device comprising:
a semiconductor chip;
a plurality of leads for connecting the semiconductor chip to a printed circuit board;
a first portion of the mounting device for mounting the semiconductor chin, said plurality of leads extending from one edge of said first portion: and
a second portion of the mounting device projecting substantially perpendicular to the first portion to support said mounting device on said printed circuit board, and wherein said lead are substantially perpendicularly bent to connect with the printed circuit boards.

8. The mounting device as in claim 7, wherein said mounting device further includes a third portion positioned so that the said semiconductor chip is between said third portion and said printed circuit board.

9. The mounting device as in claim 8, wherein said third portion is bent to provide protection for said semiconductor chip.

10. The mounting device as in claim 8, wherein said third portion is bent toward a side of the mounting device opposite said leads.

11. The mounting device as in claim 8, wherein said third portion projected in a direction opposite to a side of the semiconductor chip.

12. The mounting device as in claim 7, wherein said second portion is spring loaded so as to engage with said mounting device.

13. The surface mounted integrated circuit as in claim 7, wherein said mounting device further includes an additional semiconductor chip mounted opposite said semiconductor chip.

* * * * *